(12) United States Patent
Carter

(10) Patent No.: US 11,302,840 B2
(45) Date of Patent: Apr. 12, 2022

(54) SOLAR CELL WITH THREE LAYERS AND FORWARD BIASING VOLTAGE

(71) Applicant: Vandette B. Carter, Yorktown Heights, NY (US)

(72) Inventor: Vandette B. Carter, Yorktown Heights, NY (US)

( * ) Notice: Subject to any disclaimer, the term of this patent is extended or adjusted under 35 U.S.C. 154(b) by 0 days.

(21) Appl. No.: 16/669,359

(22) Filed: Oct. 30, 2019

(65) Prior Publication Data

US 2020/0135954 A1 Apr. 30, 2020

Related U.S. Application Data

(60) Provisional application No. 62/753,062, filed on Oct. 30, 2018.

(51) Int. Cl.
*H01L 31/075* (2012.01)
*H01L 31/053* (2014.01)
*H01L 31/02* (2006.01)

(52) U.S. Cl.
CPC ...... *H01L 31/075* (2013.01); *H01L 31/02008* (2013.01); *H01L 31/053* (2014.12)

(58) Field of Classification Search
CPC .......................... H01L 31/075; H01L 31/053; H01L 31/02008
See application file for complete search history.

(56) References Cited

U.S. PATENT DOCUMENTS

2013/0056712 A1* 3/2013 Jain .................. H01L 31/02167
257/40
2020/0381567 A1* 12/2020 Cao .................... H01L 31/0488

OTHER PUBLICATIONS

Olivia-Chatelain et al., Doping Silicon nanocrystals and quantum dots, Royal Society of Chemistry, Nanoscale, pp. 1733-1745 (Year: 2016).*
P-N Junction Semiconductor Diode, Physics and Radios Electronics, https://www.physics-and-radio-electronics.com/electronic-devices-and-circuits/semiconductor-diodes/pnjunctionsemiconductordiode.html, downloaded Mar. 5, 2021, pp. 1-5 (Year: 2021).*

* cited by examiner

*Primary Examiner* — Jayne L Mershon
(74) *Attorney, Agent, or Firm* — Ohlandt, Greeley, Ruggiero & Perle, L.L.P.

(57) ABSTRACT

Solar cells efficiency is improved, in a first approach, wherein the anode's "top contact" is relocated to the middle of a three-layer solar cell wafer, permitting maximum sunlight photons to excite free electrons in the anode and p-n junction, without causing obstruction or reflection of sunlight therein. In another embodiment, a rechargeable battery of at least 0.1 v is used, to create forward biasing of electrons in a solar cell, having an impurity level that is less than 99.999999%. The anode and cathode of a silicon base solar cell is doped with more than one element, other than phosphorous and boron, to increase its performance and decrease its manufacturing cost.

5 Claims, 4 Drawing Sheets

SOLAR CELL WITH THREE LAYERS AND FORWARD BIASING VOLTAGE

This application claims priority from and the benefit of provisional application Ser. No. 62/753,062 filed on Oct. 30, 2018, the entire contents of which are incorporated herein by reference, for all purposes.

BACKGROUND OF THE INVENTION

Field of the Invention

The present invention relates to mono-crystalline and polycrystalline silicon wafer solar cells, having a "P" and "N" doped layers. More specifically, it relates to solar cells having a new "Z" non doped layer forming a middle layer; and a bottom layer and a top layer, forming a cathode and an anode respectively.

Description of Prior Art

Conventional photovoltaic (PV) wafers are assembled with a top layer, forming the anode, and a bottom layer, forming the cathode when doped with phosphorous and boron respectively.

It is well appreciated that the anode, top layer, impedes the maximum exposure of sunlight into the solar wafer when a top contact is placed above said layer, limiting the maximum efficiency of the solar cell.

Manufacturers have sought to address this obstruction of sunlight into the solar cell by implementing novel technologies such as devising "transparent" top contact as described in United States Patent Publication No. 2009/0277500 and U.S. Pat. No. 8,980,677, which are invariably applicable to silicon solar cells. The "transparent" top contact with nearly invisible electrode, will inadvertently reduce the surface area of the anode, even though it permits more sunlight to enter the solar cell when exposed to photons, causing a paradoxical effect, whereby excited electrons are not conducted efficiently.

SUMMARY OF THE INVENTION

An object of the disclosure is to improve the efficiency of a silicon wafer PV cell by maximizing the exposure of the top layer to sunlight.

A PV silicon wafer without an exposed "top contact" (over the anode) layer will clearly offer more benefit, compared to its counterpart, with a "top contact", as more sunlight is allowed to enter a solar cell having no "top contact" which will result in a greater photoelectric effect and electron conduction (emf).

It is estimated that greater than 10%-30% of a conventional silicon PV cell surface area is covered by the anode (top contact). As such, the efficiency level can therefore be improved by at least 10%, by reconfiguring the anode ("top contact") to be totally void of obstruction Thus, the present disclosure is directed to a silicon wafer or PV cell, with semiconductor property, having a valence of four electrons, which includes silicon, carbon and other elements within group four, such as germanium.

A silicon wafer that has not been doped with boron or phosphorous or other elements as will be discussed, will have the property of an insulator, and therefore can be positioned in the center (middle) of a traditional solar cell to create a new and improved solar cell. Accordingly, to conserve on manufacturing cost of a more efficient solar cell matrix, the third non-doped layer will prove beneficial to Si (silicon) wafer type of solar cells. The non-doped "Z" layer may comprise of silicon, carbon or any other group four element, that does not conduct electrons readily when purified and having no electrical charge. A similar non-doped configuration can also be applied in thin film solar cells, without departing from the scope of the invention.

In an alternate embodiment, a rechargeable battery of a voltage less than the voltage of the electric field formed by a PV semiconductor, fabricated from a group 4 element, is used to create "forward biasing" of electrons therein, acting as an electron pump in the process.

Further, to improve the performance of "low purity" silicon cells, selective elements with conductive and electron affinity properties such as gold and iodine are added to the anode and cathode to improve the performance of a solar cell, creating an electric field between the anode and cathode of at least 0.2 v, to permit the flow of electrons freely, with or without the aid of a battery, when exposed to sunlight.

DETAILED DESCRIPTION OF THE PREFERRED EMBODIMENTS

A conventional solar wafer of silicon type consists primarily of a top conducting anode layer, and a bottom conducting cathode layer, whereby the bottom layer has a significantly larger surface area when compared to the minute surface area of the anode, whereas the anode is constructed as such to permit maximum sunlight to enter the solar cell between its spaces There is a trade off to make the "top contact" surface area as small possible to fulfill said purpose.

Moreover, excited electrons must travel upward into relatively widely spaced apart anode "top contact" for electrons uptake to take place to be available for use in a circuit.

A new and improved solar cell having three layers is described, to allow maximum sunlight to enter the solar cell, to excite free electrons. The anode (top contact) is relocated from the top surface of the solar cell, and positioned above the middle layer. The middle layer is made from non-doped silicon based element, labeled as "Z", in FIGS. 1 and 2. The bottom layer, typically doped with boron, to create holes, will have a "bottom contact" attached thereto in the usual manner, to create the cathode.

Figure 1:
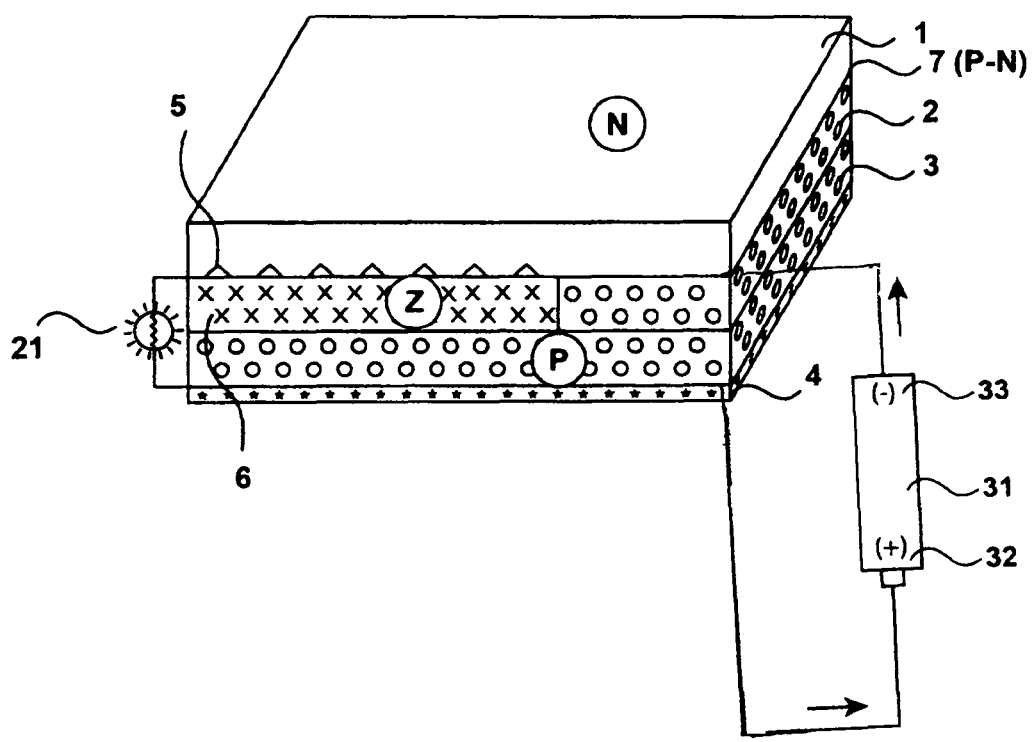
FIG. 1 is a perspective view of the three-layer solar cell in stacked formation.
Figure 2:
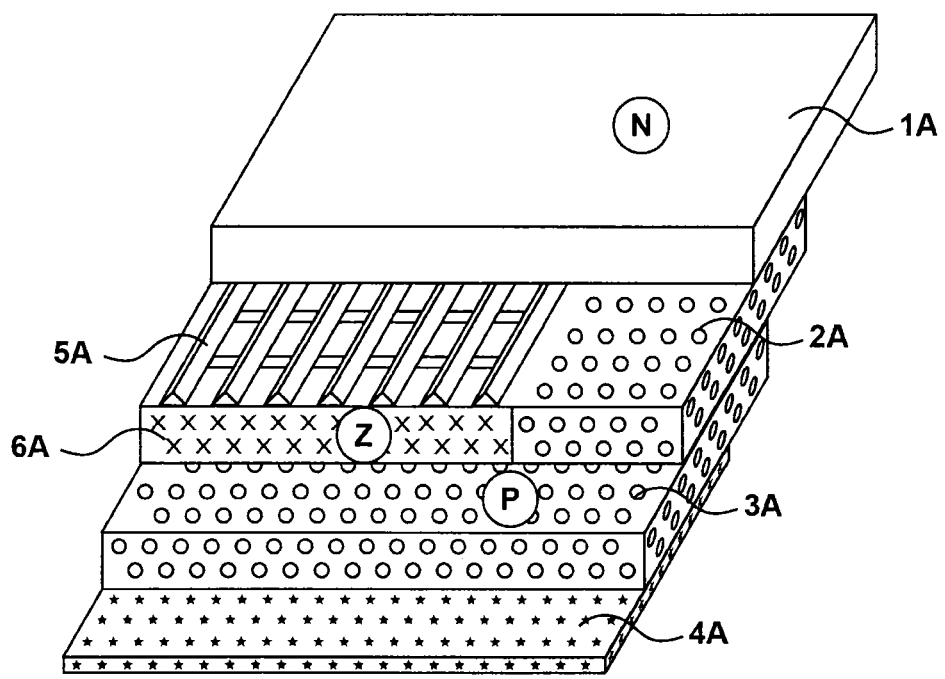
FIG. 2 is a partial exploded view of the three-layer solar cell showing the internal view of the main parts

A p-n junction is created when either an extra segment of the "P" doped layer or "N" doped layer forms part of the middle layer (see FIGS. 1 and 2). The other portion is comprise of a non-doped "Z" wafer of pure silicon, having no hindering impurities within, therefore inhibiting the flow of electrons across or though it to the "n" doped or "p" doped region A "p-n" junction with a doped boron and a doped phosphorous layers of a silicon based solar cell will have a voltage potential of ~0.6 v, when fused together to form an electric field.

A new "p-n" junction in the middle of the three layer solar cell is created when the middle layer doped segment, is an extension of either the top "n" or bottom layer "p" layer.

In the forgoing disclosure of an improved solar cell matrix, which is designed to increase the absorption (photons) of sunlight from the top n-layer, anode, having no "top contact;" conductor material, the new "top contact" is repositioned to the middle of the solar cell 5 and 5A, —which is positioned between the bottom of the "n" type anode 1 and 1A, and above the non-doped Z-layer, 6 and 6A, as in FIG. 1 and FIG. 2, respectively.

The extended "p" doped segment depicted in FIG. 1 and FIG. 2 is preferably of a size that is 50%, or greater than 50% of the surface area of the middle portion; whereas the "Z" non-doped segment is preferably 50% or less than 50% of the middle layer surface area. As such, an extended "p" doped segment will form a "p-n" junction with the top layer 1, "n" type, or an extended "n" doped segment placed into the middle of the solar wafer, will form a "p-n" junction with the bottom layer 4 (not shown).

The non-conducting "Z" segment serves the purpose of creating an insulated layer between the "p" doped layer and the "n" doped layer, so that the "top contact" 5 (or 5A), having a contact structure well known in the art, can form a circuit with bottom contact 4 or 4A, of FIGS. 1 and 2, respectively.

The non-conducting layer may comprise a highly purified non-doped group 4 element such as carbon, silicon or germanium.

A solar cell having three layers as described will permit close to 100% of sunlight to enter the solar cell (not factoring reflection or refraction caused by factors other than the top contact), to excite free electrons situated in the anode and p-n junction, in order to carry an electric charge. Moreover, the excited electrons will have a larger surface area of "top contact" to conduct electricity, situated above the non conducting "Z" layer, allowing for maximum number of excited electrons to be conducted from the anode, thereby increasing the efficiency of a new and improved solar cell.

Figure 4:
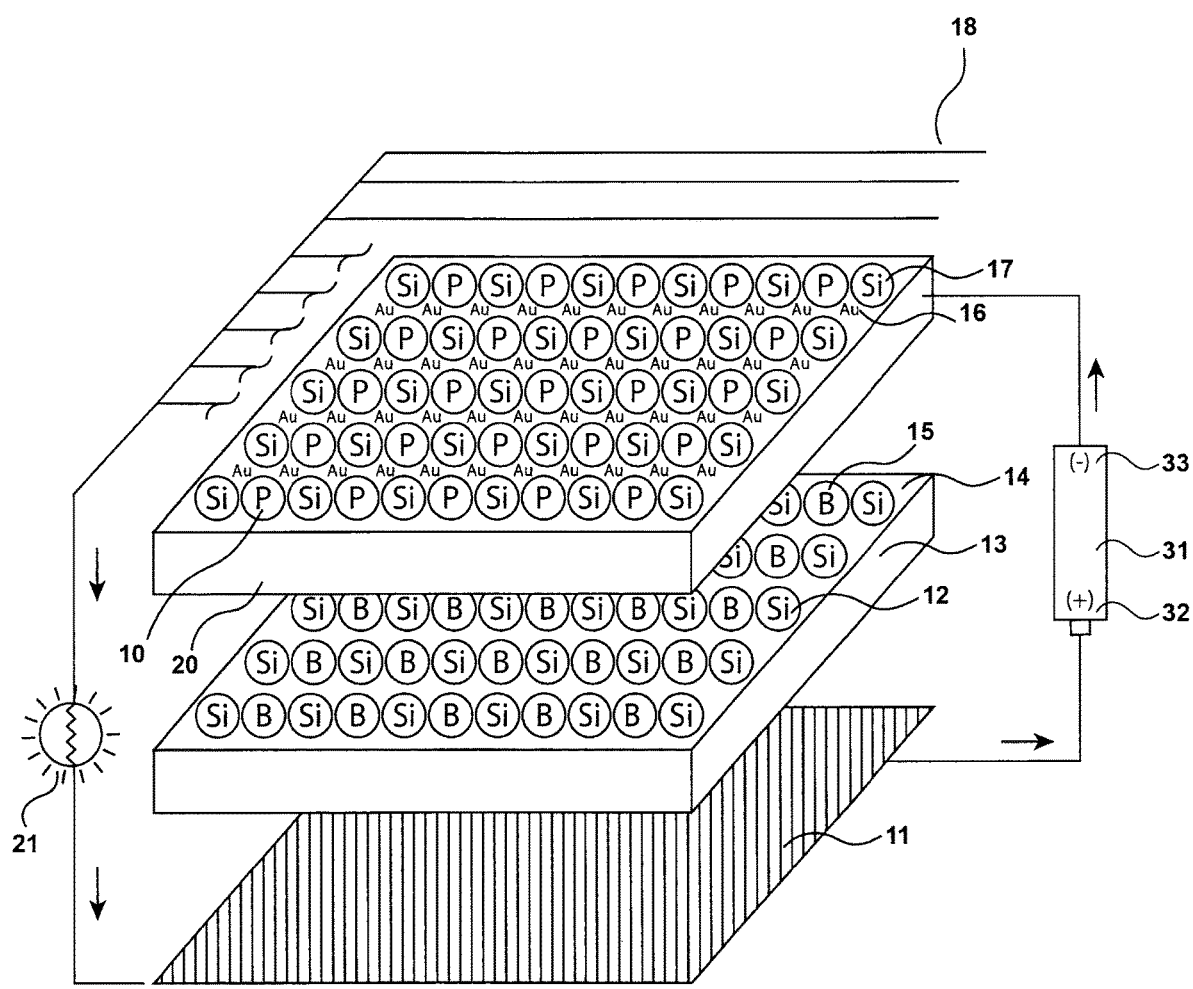
FIG. 4 is a layered view of a typical two-layer solar cell with front contact omitted (for visibility) and a rechargeable battery in place, to provide emf in one direction.

A battery 31, having terminals 32 and 33, can forward bias the photovoltaic cell in a manner similar to that shown in FIG. 4.

Forward Biased PV Cell

Figure 3:
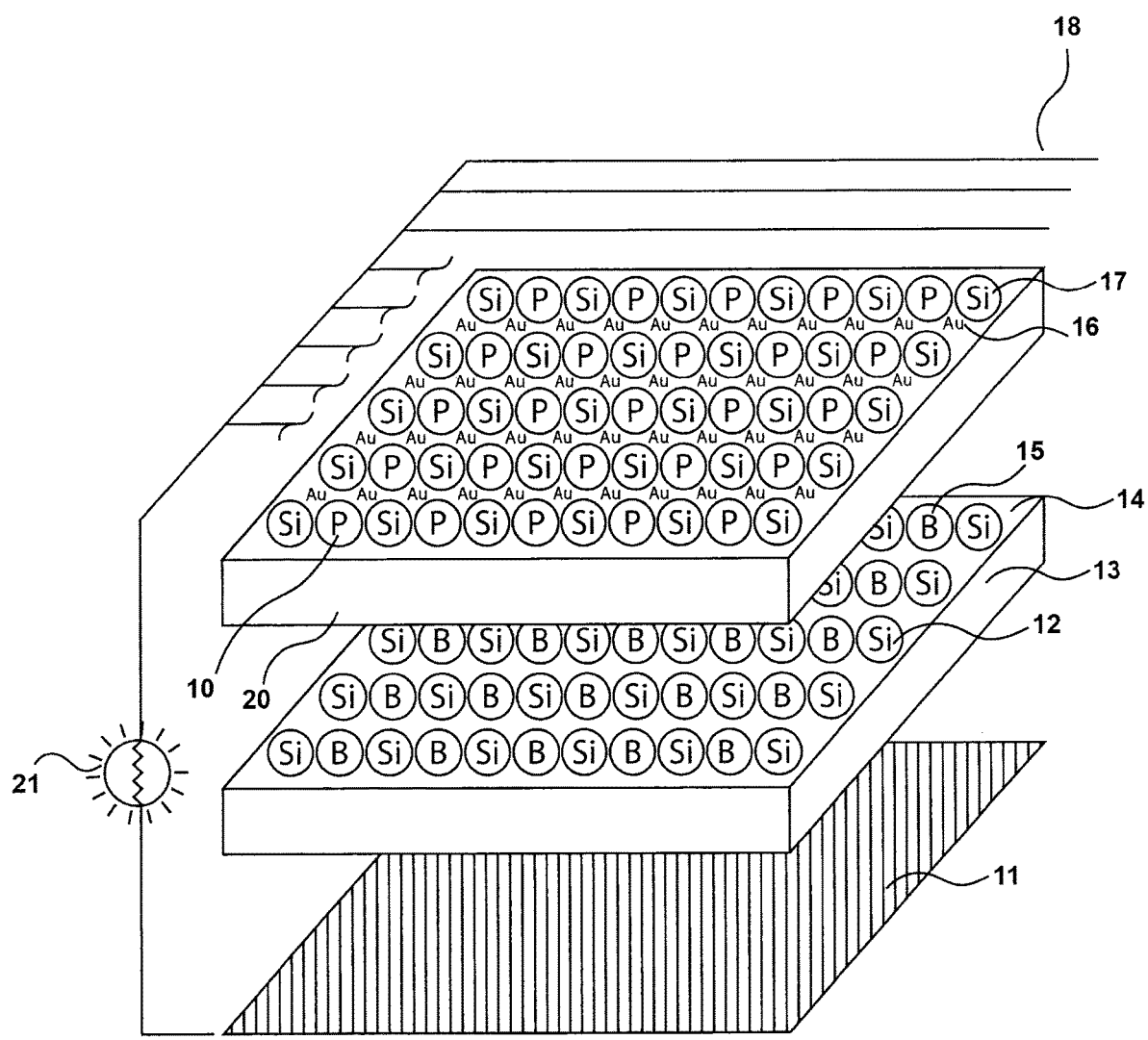
FIG. 3 is a layered view in separated form of a typical solar cell anode and cathode, whereby the anode is doped with two elements and cathode with one element.

In another solar cell embodiment, designed to reduce the manufacturing cost and production process of a silicon wafer, a forward biasing (diode) stacked PV is created, using a two layer or three layer silicon wafer design, whereby the silicon is not highly pure to the order of 99.999999% In FIG. 3 and FIG. 4, a two layer solar cell is depicted.

A silicon ingot of purity between 98 and 99.9% can be achieved using simple metallurgy process of melting silicon dioxide (quartz), using an arc furnace. The "high grade" ingot is not pure enough to create a natural p-n junction electric field of at least 0.6 volts.

To increase the solar cell p-n junction formation of at least 0.2 volts and efficiency level—without utilizing complex and costly manufacturing process, the anode and or cathode of the solar cell is preferably doped with two dopants instead of one.

In addition to phosphorous, which is commonly used in the industry to create the "n" type layer, anode, small quantity of pure gold (which is non-corrosive), silver or copper, both preferably coated with gold, is added to the anode. The addition of a highly electrically conductive metal, such as gold or copper, all having one valence electron, will make the anode more conductive to the photovoltaic effect, and create a p-n junction of at least 0.2 volts in a new amalgamated solar cell.

A group seven element, such as iodine, with seven (7) valence electrons may be used to dope the cathode layer, in addition to boron, to create a more conductive solar cell positive end, as iodine has a strong affinity for a single electron.

Referring to FIG. 4, to facilitate the flow of electrons in one direction of a typical solar cell, a rechargeable battery of suitable voltage, ideally of at least 0.1 volt, is added to the circuit, to facilitate the flow of electrons toward the cathode, thereby overcoming potential resistance caused by unwanted impurities in the semiconductor material. Gold and iodine respectively will also facilitate forward biasing given their high conductivity and affinity for electrons, respectively.

When electrons flow towards the cathode upon exposure of the completely exposed anode "n" type to the sun, the rechargeable battery will forward bias the electrons, acting as an electron pump and will be recharged by using a resistor (not shown), in series with the battery, to recharge said battery. The rechargeable battery may have a voltage output of 0.1 volt or greater, but preferably below the value of the electric field of the p-n junction of the photovoltaic cell.

What is claimed is:

1. A photovoltaic cell and a rechargeable battery in combination, in a circuit, wherein the photovoltaic cell comprises:
   a p layer;
   an n layer;
   a non-doped layer having no electrical charge disposed between the p layer and the n layer, the non-doped layer having a surface area which is less than the surface area of the p layer or the n layer, wherein either the p layer or the n layer extends adjacent the non-doped layer to form a p-n junction of the p layer and the n layer; and
   the battery having a voltage selected so as to promote forward biasing of excited electrons in the p-n junction of the photovoltaic cell.

2. The combination of claim 1, wherein the battery has a voltage of at least 0.1 volt, but is below a voltage of the p-n junction of the photovoltaic cell.

3. The combination of claim 1, wherein one of the p layer and the n layer of the photovoltaic cell is doped with two elements.

4. The combination of claim 3, wherein one of the two elements is selected from the group consisting of gold and iodine.

5. The combination of claim 1, further comprising a top contact situated below an anode of the photovoltaic cell and above the non-doped layer.

* * * * *